(12) United States Patent
Benner

(10) Patent No.: US 6,437,353 B1
(45) Date of Patent: Aug. 20, 2002

(54) PARTICLE-OPTICAL APPARATUS AND PROCESS FOR THE PARTICLE-OPTICAL PRODUCTION OF MICROSTRUCTURES

(75) Inventor: Gerd Benner, Aalen (DE)

(73) Assignee: Carl-Zeiss-Stiftung (DE)

( * ) Notice: Subject to any disclaimer, the term of this patent is extended or adjusted under 35 U.S.C. 154(b) by 0 days.

(21) Appl. No.: 09/453,991

(22) Filed: Dec. 2, 1999

(30) Foreign Application Priority Data

Feb. 12, 1998 (DE) .......................................... 198 55 629

(51) Int. Cl.⁷ ........................... H01J 37/153; G03F 9/00
(52) U.S. Cl. ............... 250/492.23; 250/492.2; 250/492.3; 250/396 R; 250/398
(58) Field of Search .................. 250/492.2, 492.23, 250/492.3, 396 R, 398

(56) References Cited

U.S. PATENT DOCUMENTS

| | | |
|---|---|---|
| 4,740,704 A | 4/1988 | Rose et al. |
| 4,760,261 A | 7/1988 | Rose et al. |
| 5,079,112 A * | 1/1992 | Berger et al. ................. 430/4 |
| 5,449,914 A | 9/1995 | Rose et al. |
| 5,912,469 A * | 6/1999 | Okino .................... 250/492.23 |

* cited by examiner

Primary Examiner—Bruce Anderson
Assistant Examiner—Nikita Wells

(57) ABSTRACT

The invention relates to a particle-optical apparatus for particle-optical mask projection. According to the invention, an energy filter is used, by which particles which are inelastically scattered in a mask plane are separated from particles which are elastically scattered in the mask plane. Particles from a selected energy range are used for the particle-optical imaging of the mask in the final image plane. The energy filter is an imaging energy filter, the mask plane being coincident with the input image plane of the energy filter or being imaged in it. The output image plane of the energy filter is imaged, reduced in scale, by a following imaging system on a wafer arranged in the projection plane. Beam deflection systems are provided in addition, by which the particle beam is deflectable in the mask plane and onto out-of-axis regions, so that different regions of the mask plane can be imaged in the image plane at successive times.

24 Claims, 3 Drawing Sheets

PARTICLE-OPTICAL APPARATUS AND PROCESS FOR THE PARTICLE-OPTICAL PRODUCTION OF MICROSTRUCTURES

CROSS-REFERENCE TO RELATED APPLICATIONS

Not applicable

STATEMENT REGARDING FEDERALLY SPONSORED RESEARCH OR DEVELOPMENT

Not applicable.

REFERENCE TO A MICROFICHE APPENDIX

Not Applicable

BACKGROUND OF THE INVENTION

1. Field of the Invention

This invention relates to a particle-optical apparatus, and more particularly to a particle-optical apparatus for microstructures for semiconductor lithography.

For the particle-optical production of microstructures, for example, for semiconductor lithography, it is known to construct a mask which is to be imaged on a reduced scale, either as a self-supporting mask or as a thin membrane with strongly scattering thicker structures. With self-supporting masks, however, no hollow structures are possible, i.e., structures which have no connection to the mask edge. Since however the projection of such hollow structures is often required in semiconductor lithography, the range of application of self-supporting masks is greatly limited. Furthermore, particle absorption in the mask structure leads to differential heating of the mask, easily resulting in a mask deformation.

2. Discussion of Relevant Art

These disadvantages do not arise with transparent masks, in which a strongly scattering structure is applied to a weakly scattering membrane. However, there is instead the disadvantage of a very low contrast, since contrast generation, as is known from U.S. Pat. No. 5,079,112, for example, takes place by means of an aperture diaphragm which is located downstream of the mask, and which either permits the transmission only of particles which emerge from the mask at a large scattering angle (this substantially corresponds to dark field contrast), or permits the transmission only of particles which emerge at a small scattering angle (this substantially corresponds to a bright field contrast). Since, however, both strongly scattering and weakly scattering regions always produce large ranges of scattering angles, which differ only in their statistical distribution, there results the weak contrast which has already been mentioned.

SUMMARY OF THE INVENTION

The present invention therefore has as its object to provide a particle-optical apparatus and a particle-optical process, with which microstructures applied to a thin membrane can be imaged with high contrast.

This object is attained with a particle-optical apparatus with a mask holder to receive a mask in a mask plane and an imaging energy filter following the mask holder, wherein the mask plane is imaged on a reduced scale in an image plane by means of the energy filter.

This object also is attained by a process for the particle-optical production of microstructures, wherein a mask with inelastically scattering microstructures is imaged on a reduced scale on a wafer by means of an energy filter, and wherein particles of a predetermined energy loss are selected with the energy filter.

The particle-optical apparatus according to the invention has an imaging energy filter arranged after a mask which carries the microstructure. Inelastically scattered particles of a predetermined energy window are filtered out by means of the energy filter. The imaging of the mask on a reduced scale in the image plane or projection plane then takes place by means of an imaging system which is arranged downstream of the energy filter.

The invention is accordingly based on the idea of using for the generation of contrast a separation of the particles according to their energy or according to their energy differences, after interaction with the mask which is to be imaged. Since the energy loss of the particles is strongly element-specific, a high imaging contrast can be produced by the use of different materials for the membrane on the one hand and the microstructure on the other hand. There is then no problem if both the membrane and the microstructure scatter inelastically, as long as the energy loss spectra of the materials used for the membrane and for the microstructure are sufficiently different, so that a separation of the inelastically scattered particles from the inelastically scattered particles, according to energy, is possible at the output of the energy filter. However, it is preferable, in connection with the apparatus according to the invention and the process according to the invention, if the mask which carries the microstructure consists of a support foil which scatters the particles elastically, with a microstructure which scatters inelastically. In such a case, the inelastically scattered particles are preferably filtered out at the output of the energy filter, so that only the elastically scattered particles contribute to the imaging of the mask, since these have the smallest spectral distribution.

The imaging of the mask plane in the image plane is to take place such that the image of the mask on the image plane is at most half as large as the mask (scale or reduction smaller than 0.5). The energy filter should preferably be constituted as a so-called imaging energy filter, which images a first plane on the input side (the input image plane) achromatically into a first plane on the output side (output image plane), and a second plane on the image side dispersively into a second plane on the output side (dispersive plane). The mask is then either to be arranged in the first plane on the input side, or to be imaged by an imaging stage, which follows the mask, into this first plane on the input side of the filter.

A preparation holder, which receives the wafer to be structured, is preferably arranged in or behind the image plane of the apparatus. This preparation holder is to be movable by motor in two mutually perpendicular directions, which are perpendicular to the optical axis of the particle-optical apparatus. Likewise, a preparation holder which receives the mask and is movable by motor in two mutually perpendicular directions, which are again perpendicular to the optical axis of the particle-optical apparatus, is to be arranged in the mask plane. By means of corresponding coupling of the movement of the preparation holder in the mask plane with the movement of the preparation holder in the image plane, different regions of the mask can be successively imaged, energy filtered, on different regions of the wafer to be arranged in the image plane, so that mask fields which are larger than the respectively transmitted image field can be imaged by successive projections.

A condenser system can be arranged between the particle source and the mask plane. Such a condenser system makes it possible to provide a collimated beam path in the mask plane.

Furthermore, there can be provided a first deflecting system between the particle source and the mask plane, a second deflecting system between the mask plane and the energy filter, and a third deflecting system behind the energy filter. Each of these three deflecting systems can be constructed in a known manner as a double deflection system. The first and second deflecting systems are then preferably excited such that a particle beam entering the first deflecting system parallel to the optical axis is deflected to an out-of-axis region on the mask plane, and behind the mask plane is deflected back again in the direction toward the optical axis. An out-of-axis deflection then again takes place behind the energy filter by means of the third deflecting system. With the described combination of deflecting systems, different regions of the mask to be arranged in the mask plane can be imaged on different regions of the wafer which is to be received in the image plane behind the energy filter. In this manner, successively larger mask regions can be imaged on the wafer electron-optically, i.e., without mechanical movement of the mask and wafer relative to each other. However, it is particularly advantageous in this connection if the particle-optical deflection and the mechanical movement are combined together, such that by means of suitable machine control, respectively two or more particle-opticalally produced image displacements take place respectively between two mechanical movements of the mask holder in the mask plane and of the preparation holder in the imaging plane.

The particles used for mask imaging in connection with the invention can be electrons or ions, the use of electrons being preferred since the components required for the invention are basically known from transmission electron microscopes.

BRIEF DESCRIPTION OF THE DRAWINGS

Details of the invention are explained hereinbelow with reference to the preferred embodiments shown in the accompanying Figures, in which.

DETAILED DESCRIPTION OF PREFERRED EMBODIMENTS

Figure 1:
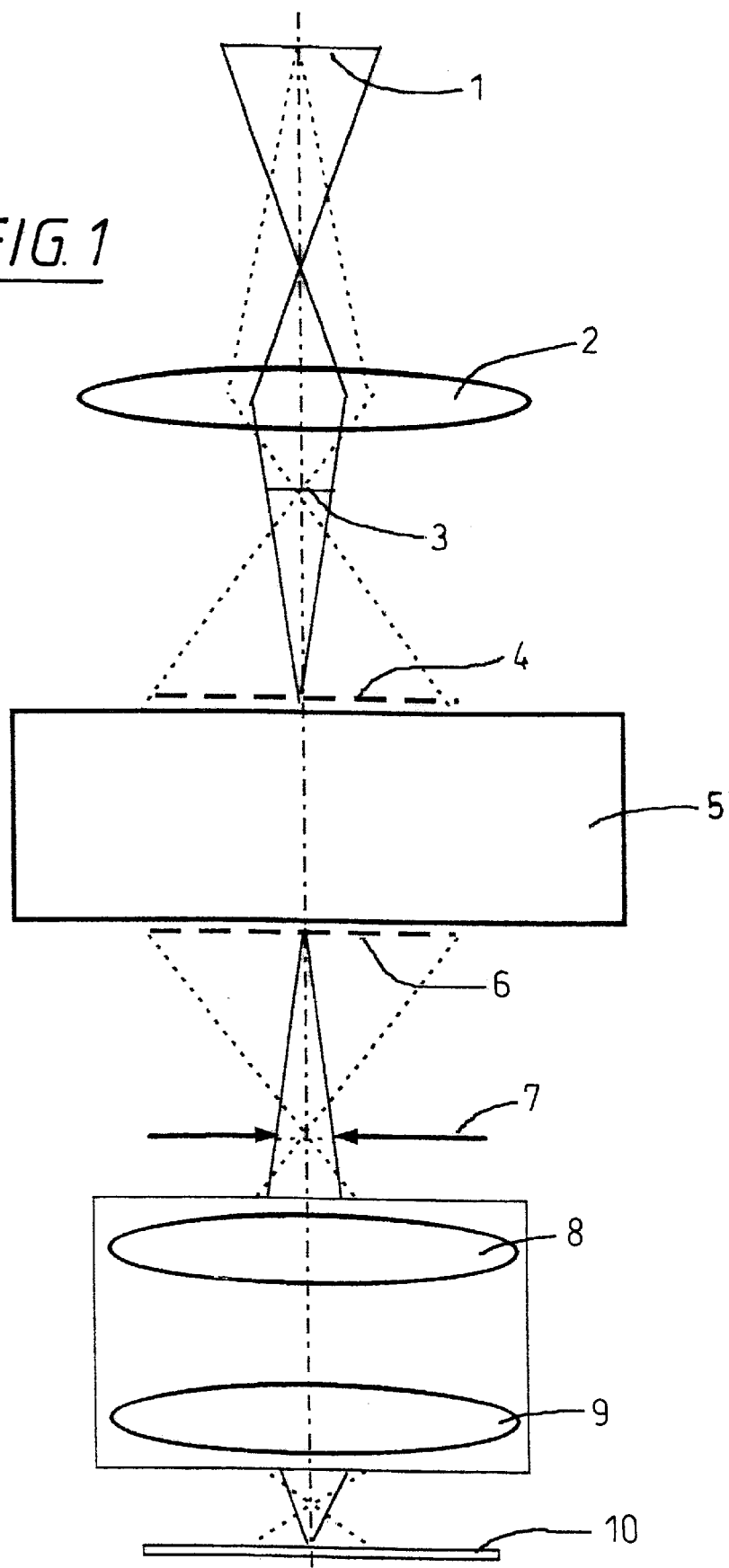
FIG. 1 shows a simplified sketch of the principles of a particle-optical apparatus according to the invention.

The crossover of a particle source, for example, an electron source, is denoted by (1) in FIG. 1. A condenser (2) forms a real image of this crossover plane (1) in a crossover plane (3). Seen in the direction of propagation of the particles, the mask plane (4) is situated behind the crossover plane (3), so that a mask arranged in the mask plane (4) is uniformly illuminated over a wide area.

The mask plane (4) is arranged before an energy filter (5) in the beam direction. This energy filter is constituted as a so-called imaging energy filter, which images a first plane on the input side, the input image plane, achromatically into a first image plane on the output side, the output image plane, and a second plane on the image side, the input diffraction plane, dispersively into a second plane on the output side, the selection plane or dispersive plane. Energy filters of this kind are known for electrons, for example from U.S. Pat. No. 4,740,704, U.S. Pat. No. 4,760,261, or U.S. Pat. No. 5,449,914. There is therefore no need to go more closely into details here concerning their construction.

In the simplified apparatus shown in FIG. 1, the mask plane (4) coincides with the input image plane of the filter, and the crossover plane (3) with the input diffraction plane of the energy filter. Accordingly, the energy filter (5) images the mask plane (4) achromatically into the output image plane (6), and the crossover plane (3) dispersively into the dispersion plane (7); the scale of imaging, both for the imaging of the input image plane and for the imaging of the input diffraction plane, therefore has to be 1:1, so that as symmetrical as possible a course of the particle paths in the energy filter is insured, whereby imaging errors in the filter are furthermore prevented. A slit diaphragm, by means of which particles are selected which have undergone a predetermined energy loss, is arranged in the dispersion plane (7). The energy loss which is predetermined by the slit diaphragm (7) can then be set to the element-specific energy loss of the microstructure of the mask to be arranged in the mask plane (4).

Seen in the propagation direction of the particles, a projection system (8, 9) follows behind the slit diaphragm (7), and by means of it the output image plane (6) of the energy filter (5) is imaged on a reduced scale in the image plane (10). The scale of imaging of the projection system is then about 0.25, so that the region of the mask plane (4) transmitted by the energy filter (5) appears to be reduced to quarter size in the image plane (10).

In the simplified embodiment shown in FIG. 1, no particle-optical selection of different regions in the mask plane (4) is possible. In order to image larger mask regions completely in the image plane (10), a mechanical relative movement is required here, both of the mask to be arranged in the mask plane (4) and also of the wafer to be arranged in the image plane (10). The wafer stage used in electron-optical inspection equipment (not however shown in FIG. 1) can be used for the corresponding movement of the mask and of the wafer. The movements of the wafer stage in the mask plane (4) and in the image plane (10) are then to be coupled together so that the ratio of the movement stroke of the mask and the movement stroke of the wafer corresponds to the scale of imaging between the mask plane (4) and the image plane (10).

Figure 3:
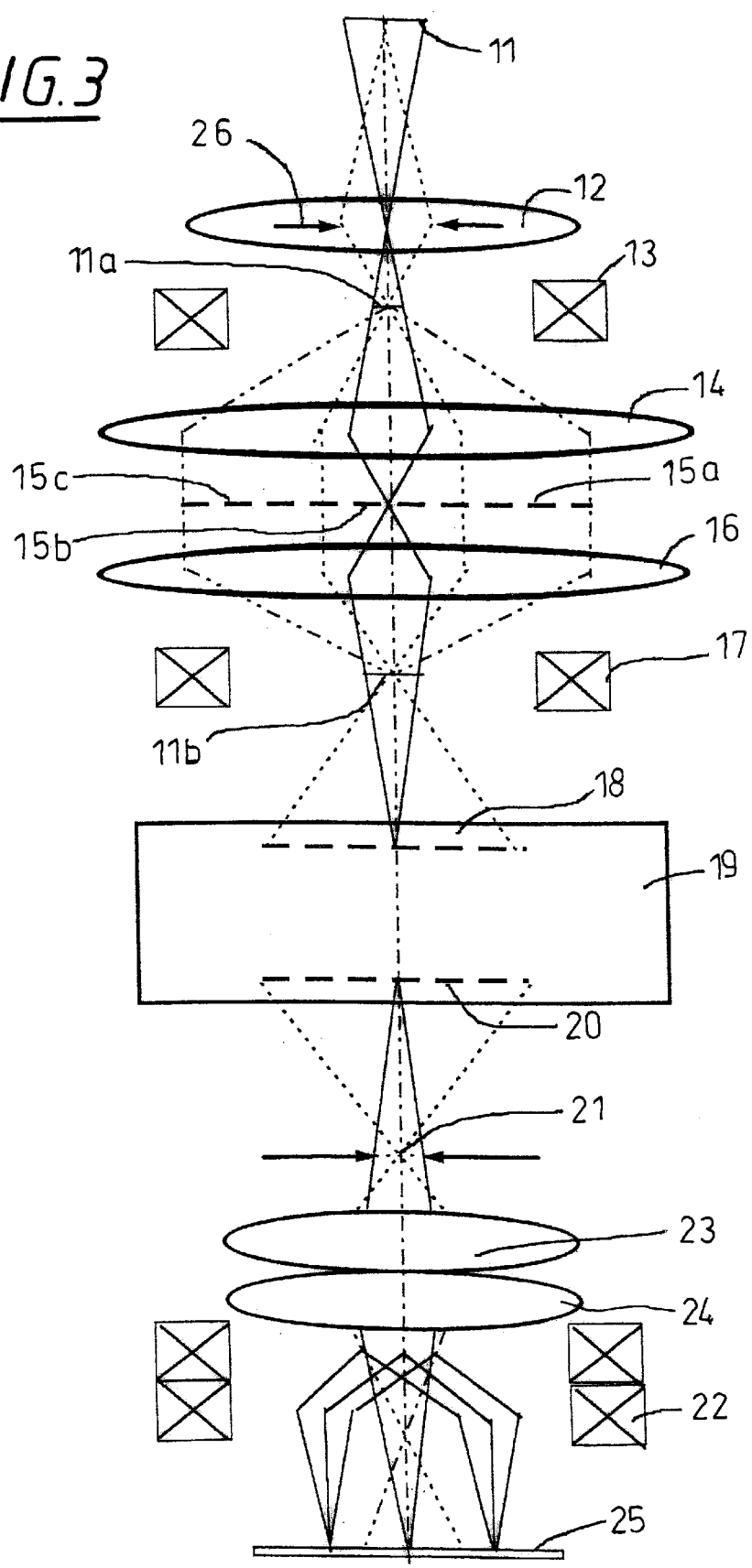
FIG. 3 shows a sketch of the principles of an embodiment of the invention with a particle-optical region selection in the mask plane.

In the embodiment example in FIG. 3, the particle source is denoted by (11). Here also, a condenser lens (12) produces a real image (11a) of the source (11), a so-called crossover. A first deflecting system (13) is arranged in the crossover plane. The deflecting system (13) is followed by a second condenser lens (14) which images the crossover (11a) at infinity. The mask plane (15) is situated in the parallel beam path behind the second condenser lens (14) in the beam direction. The mask holder to receive the mask is arranged in the mask plane.

In this embodiment, the mask holder can be moved by motor in two mutually perpendicular directions, which are both directed perpendicularly to the optical axis of the imaging system, in order thereby to bring different regions of the mask to be recorded into the particle-optical imaging beam path.

A third condenser lens (16) follows the mask plane, and images the mask plane (15) into the input image plane (16) of the energy filter (19). The two condenser lenses (14, 16) can also be embodied as a so-called condenser-objective single field lens.

Here also the energy filter (19) concerned is an imaging energy filter, which achromatically images the input image plane (18) in the output image plane (20) and at the same time images an input diffraction plane dispersively into a selection plane (21) on the output side. A slit diaphragm is again provided in the selection plane (21), and a predetermined energy loss can be set by means of it. The image of the mask plane (15) present in the output image plane (20) of the energy filter (19) is once again imaged on a reduced scale in the final image plane (25) by a following projection system (23, 24).

According to the excitation of the deflecting system, a deflection of the particle beam perpendicularly to the optical axis can take place in the plane of the crossover (11a) in front of the mask plane (15) by means of the first deflecting system (13), so that according to the excitation of the deflecting system (13), different lateral regions (15a, 15b, 15c) in the mask plane (15) can be illuminated. The particle beam which runs telecentrically out-of-axis in the mask plane (15) is deflected back again toward the optical axis by the third condenser lens (16). By means of a second deflecting system (17) which is arranged in the rear focal plane of the third condenser lens (16), there takes place a return deflection or tilting of the particle beam, which is directed exactly in opposition to the deflection produced by the first deflection system (13), so that the further propagation of the particle beam behind the second deflecting system (17) is independent of the deflection produced by the first deflecting system. Accordingly, the propagation of the particle beam within the energy filter (19) is also independent of the beam deflection attained in the mask plane. A third deflecting system (22), which effects a beam deflection around the optical axis in the selection plane (21), furthermore produces a final beam deflection, which is coupled to the beam deflection in the mask plane such that regions situated adjacently in the mask plane are imaged successively on regions situated adjacently in the image plane (25). Overall, larger field regions in the mask plane (15) can be imaged, successively energy-filtered, in the image plane (25) by means of this particle-optical beam deflection. However, in order to transmit even larger image fields from the mask plane (15) into the image plane (25), the preparation holder, which holds the preparation to be structured, as a rule a wafer, in the image plane (25), had also in this embodiment to be constituted as a motorized wafer stage, so that the desired large image fields can be transmitted by means of corresponding mutually coupled movement, both of the mask to be recorded, in the mask plane (15), and also of the wafer to be held in the image plane. It is then of course appropriate to produce, between the mechanical movements of the mask and of the wafer, respectively composed larger partial image fields by particle-optical beam deflection by means of corresponding changes of the excitations of the deflecting systems (13, 17 and 22).

The individual particle-optical components are shown in a simplified manner in the embodiment example of FIG. 3 also. Thus it is not absolutely necessary for the deflecting systems (13, 17, 22) to be arranged in the said respective crossover planes. It is more important that the deflecting systems produce at least virtual beam deflections around the crossover planes. To the extent that the crossover planes are, for reasons of space, not accessible for a simple beam deflection system, the deflecting systems can also be constituted in a known manner, like the deflecting system (22) behind the projection system (23, 24), as double deflecting systems which produce only a virtual tilting in the said crossover planes.

To the extent that the particles pass out-of-axis through the condenser lenses and/or the projection lenses, due to the deflections produced by the deflecting systems, a refocusing of the lenses concerned can be necessary, as can also a change of the stigmators and of the adjusting and correcting elements (not shown in the Figures), in dependence on the deflection effected by the deflecting systems. The current and voltage changes required for this refocusing and/or the changes of the stigmators and adjusting and correcting elements are stored as data tables in the control computer (not shown), the respective associated current or voltage changes being allocated to the deflections which are effected.

Figure 2:
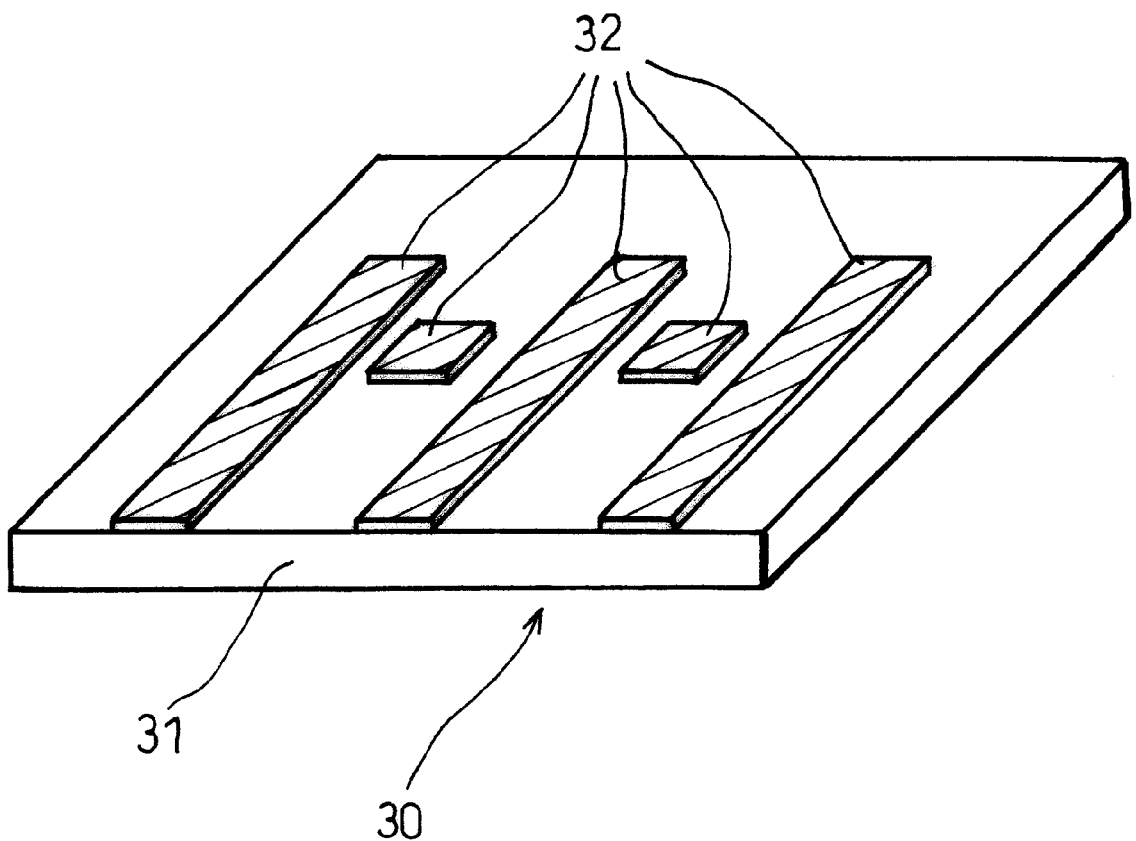
FIG. 2 shows a perspective view of a section of a mask used in connection with the invention.

A section of the mask used in connection with the apparatus is schematically shown in FIG. 2. The mask (30) consists of a thin membrane (31), for example of silicon oxide, on which the desired microstructures (32) are deposited. The microstructures (32) then have a material other than that of the membrane (31), so that the particles interacting with the microstructures (32) undergo a different energy loss than that of those particles which have been transmitted through the mask (30) outside the microstructures (32).

By the use according to the invention of an energy filtering in the imaging of the mask, there are obtained higher contrast and furthermore smaller color aberrations, i.e. energy dependent aberrations, in comparison with the known contrast generation by scattering absorption. Because only a relatively narrow energetic region of the particles is used for the imaging of the mask in the image plane, the color aberrations in the imaging system have a smaller effect. At the same time, the energy spreading due to the interaction of the particles with each other (Boersch effect) is also reduced, since the elastically scattered particles which are not used for imaging are eliminated by the energy filtering.

I claim:

1. A particle-optical apparatus, comprising:
   a mask holder to receive a mask in a mask plane, and
   an imaging energy filter following said mask holder,
   wherein said imaging energy filter images said mask plane on a reduced scale in an image plane and wherein said imaging energy filter images a plane on an input side of said imaging energy filter into a plane on an output side of said imaging energy filter dispersively.

2. The particle-optical apparatus according to claim 1, wherein said imaging energy filter images a first plane on an input side of said imaging energy filter achromatically into a first plane on an output side of said imaging energy filter and a second plane on said input side into a second plane dispersively on said output side, and wherein said mask plane is arranged in, or is imaged into, said first plane on said input side.

3. The particle-optical apparatus according to claim 1, further comprising a reducing imaging system arranged downstream of said imaging energy filter.

4. The particle-optical apparatus according to claim 1, further comprising a preparation holder arranged in said image plane and motor-movable in two mutually perpendicular directions.

5. The particle-optical apparatus according to claim 4, wherein said mask holder is motor-movable in said mask plane in two mutually perpendicular directions, and movement of said mask holder and movement of said preparation holder are coupled together.

6. The particle-optical apparatus according to claim 1, further comprising a particle source and a condenser system arranged between said particle source and said mask plane.

7. The particle-optical apparatus according to claim 1, further comprising a particle source, a first deflecting system arranged between said particle source and said mask plane, a second deflecting system arranged between said mask plane and said imaging energy filter, and a third deflecting system arranged downstream of said imaging energy filter.

8. The particle-optical apparatus according to claim 7, further comprising a third deflecting system, wherein said first and second deflecting systems are excited such that a particle beam running parallel to the optical axis passes through an out-of-axis region in said mask plane, behind said mask plane, said particle beam is deflected back toward the optical axis, and behind said imaging energy filter said particle beam is deflected by said third deflecting system to an out-of-axis region in said image plane.

9. The particle-optical apparatus according to claim 8, further comprising condenser lenses, wherein a change takes place in excitation of said condenser lenses or of further elements such as stigmators and adjusting elements or correcting elements when there is a change of deflection effected by said first, second and third deflecting systems.

10. The particle-optical apparatus according to claim 1, wherein said mask plane is situated in a collimated beam path.

11. A process for particle-optical production of microstructures, comprising:
imaging a mask with inelastically scattering microstructures on a reduced scale on a wafer by an imaging energy filter, and selecting particles of a predetermined energy loss with said imaging energy filter.

12. The process according to claim 11, further comprising employing a mask of a thin support foil with inelastically scattering microstructures.

13. The process according to claim 12, further comprising employing a support foil of an elastically scattering material.

14. The process according to claim 11, further comprising:
providing an energy filter imaging a plane on an input side of said imaging energy filter into a plane on an output side of said imaging energy filter dispersively.

15. A particle-optical apparatus, comprising:
a mask holder to receive a mask in a mask plane, and
an imaging energy filter following said mask holder,
wherein said imaging energy filter images said mask plane on a reduced scale in an image plane, and
wherein said imaging energy filter images a first plane on an input side of said imaging energy filter achromatically into a first plane on an output side of said imaging energy filter and a second plane on said input side into a second plane dispersively on said output side, and wherein said mask plane is arranged in, or is imaged into, said first plane on said input side.

16. The particle-optical apparatus according to claim 15, further comprising a reducing imaging system arranged downstream of said imaging energy filter.

17. The particle-optical apparatus according to claim 15, further comprising a preparation holder arranged in said image plane and motor-movable in two mutually perpendicular directions.

18. The particle-optical apparatus according to claim 17, wherein said mask holder is motor-movable in said mask plane in two mutually perpendicular directions, and movement of said mask holder and movement of said preparation holder are coupled together.

19. The particle-optical apparatus according to claim 15, further comprising a particle source and a condenser system arranged between said particle source and said mask plane.

20. The particle-optical apparatus according to claims 15, further comprising a particle source, a first deflecting system arranged between said particle source and said mask plane, a second deflecting system arranged between said mask plane and said imaging energy filter, and a third deflecting system arranged downstream of said imaging energy filter.

21. The particle-optical apparatus according to claim 20, further comprising a third deflecting system, wherein said first and second deflecting systems are excited such that a particle beam running parallel to the optical axis passes through an out-of-axis region in said mask plane, behind said mask plane, said p article beam is deflected back toward the optical axis, and behind said imaging energy filter said particle beam is deflected by said third deflecting system to an out-of-axis region in said image plane.

22. The particle-optical apparatus according to claim 21, further comprising condenser lenses, wherein a change takes place in excitation of said condenser lenses or of further elements such as stigmators and adjusting elements or correcting elements when there is a change of deflection effected by said first, second and third deflecting systems.

23. The particle-optical apparatus according to claim 15, wherein said mask plane is situated in a collimated beam path.

24. A process for particle-optical production of microstructures, comprising:
providing an energy filter imaging a first plane on an input side of said energy filter achromatically into a first plane on an output side of said energy filter and imaging a second plane on said input side of said energy filter into a second plane on said output side of said energy filter dispersively;
arranging a mask with inelastically scattering structures in our imaging a mask with inelastically scattering structures into said first plane on said input side of said energy filter; and
selecting particles of a predetermined energy loss with said energy filter; and
reimaging said first plane on said output side of said energy filter on a reduced scale on a wafer.

* * * * *